United States Patent [19]
Morgan

[11] Patent Number: 5,780,743
[45] Date of Patent: Jul. 14, 1998

[54] RESONANCE IDENTIFICATION IN HYDRAULIC CYLINDER PISTON POSITION SENSING

[75] Inventor: Dennis E. Morgan, San Diego, Calif.

[73] Assignee: Caterpillar Inc., Peoria, Ill.

[21] Appl. No.: 798,750

[22] Filed: Feb. 13, 1997

[51] Int. Cl.$^6$ .................................................. G01R 27/04
[52] U.S. Cl. ............................ 73/597; 324/633; 324/635; 324/636; 324/644; 92/5 R; 91/1; 91/361
[58] Field of Search ................ 73/579, 597; 324/629, 324/633–637, 644; 92/5 R; 91/361, 189 R–275, 459

[56] References Cited

U.S. PATENT DOCUMENTS

| | | | |
|---|---|---|---|
| 4,542,652 | 9/1985 | Reuter et al. | 73/597 |
| 4,588,953 | 5/1986 | Icrage | 324/585 C |
| 4,689,553 | 8/1987 | Haddox | 324/58.5 C |
| 4,737,705 | 4/1988 | Bitar et al. | 324/58.5 |
| 4,936,143 | 6/1990 | Schutten et al. | 73/597 |
| 5,150,060 | 9/1992 | Bitar | 324/635 |
| 5,182,979 | 2/1993 | Morgan | 92/5 R |
| 5,241,278 | 8/1993 | Bitar | 324/635 |
| 5,325,063 | 6/1994 | Morgan | 324/636 |
| 5,438,274 | 8/1995 | Bitar et al. | 324/636 |
| 5,471,147 | 11/1995 | Allen et al. | 324/635 |
| 5,491,422 | 2/1996 | Bitar et al. | 324/636 |
| 5,519,326 | 5/1996 | Bitar et al. | 324/636 |
| 5,608,332 | 3/1997 | Crayton et al. | 324/633 |
| 5,617,034 | 4/1997 | Lark et al. | 324/635 |

*Primary Examiner*—Hezron E. Williams
*Assistant Examiner*—Rose M. Miller
*Attorney, Agent, or Firm*—Steven G. Kibby

[57] ABSTRACT

The ability to be able to identify, distinguish and verify a lock onto harmonic frequency signals in the oil of a hydraulic cylinder using a ratio between consecutively detected harmonics. The identification is useful in providing early and reliable harmonic resonance "lock on" and the ability to "lock on" to a particular order harmonic resonance.

8 Claims, 2 Drawing Sheets

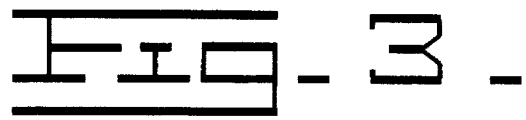
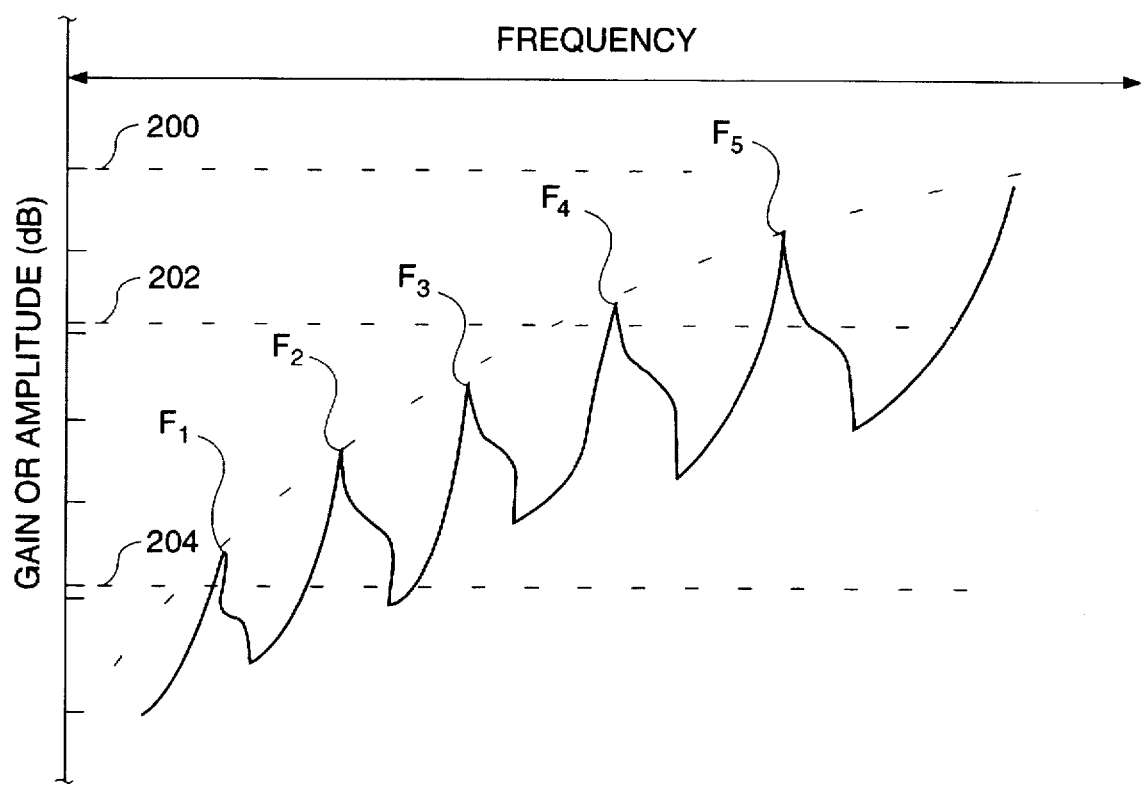

RESONANCE IDENTIFICATION IN HYDRAULIC CYLINDER PISTON POSITION SENSING

TECHNICAL FIELD

This invention relates generally to the sensing of the position of a piston in a hydraulic cylinder and in particular to the identification, in the fluid in a hydraulic cylinder, of a specific resonance that is correlated with a piston position.

BACKGROUND AND RELATION TO THE PRIOR ART

Hydraulic cylinder, piston and rod combinations are being increasingly used in many fields, a principal one of which involves the moving and positioning of material and objects. As the various applications of hydraulic cylinder, piston and rod combinations have progressed, more stringent operational criteria are being encountered, in which an ability to precisely, reliably and continuously sense the position of the piston and it's related displacement parameters, velocity and acceleration is of benefit.

A promising technique in the art for achieving such control employs the correlation of resonant frequencies of electromagnetic waves in the cavity that is made up of the cylinder and the piston with the dimensions of the cavity. The wave performance in this technique is similar to that of an electrical transmission line with shorted ends, in that the resonance frequency of an electromagnetic standing wave introduced into the hydraulic fluid in the cylinder cavity correlates inversely with the cavity length as the piston is moved.

A number of applications of the technique have appeared in the art. In one, U.S. Pat. No. 4,588,953, electromagnetic waves are introduced into a cavity formed by a closed end of the cylinder and the piston, and swept through a range of frequencies over which a resonance should occur for all possible positions of the piston. The signals are received at a separate location within the cavity and compared to a reference threshold in order to detect comparatively higher amplitude signals indicative of resonance frequencies.

In U.S. Pat. No. 5,325,063, identification of a resonance frequency is enhanced by detection of slope intercepts of the received signal. For a variety of reasons, the signal amplitude near the peak region is often indeterminate and therefore best performance is obtained using a reference threshold approximately 5 dB below peak amplitude. The positive and negative intercept frequencies C and D, alternatively described herein as periods, indicate the boundaries between which the resonance frequency is located.

In U.S. Pat. No. 5,241,278, use is made of the difference between subsequent harmonic resonance frequencies in determining piston position. Stored gain factors, selected on the basis of the frequency introduced into the cylinder, are applied to the received signal by an automatic gain control (AGC) before comparison to a threshold, in order to compensate for non-linear insertion loss across the swept range. Device and service differences however, cause excessive variation in insertion loss near resonance frequencies and make the loss difficult to predict.

Accordingly, in allowed U.S. patent application Ser. No. 08/437,611, filed May 9, 1995 and incorporated herein by reference, a dynamic gain adjustment is made to received signals to enhance accurate detection of positive and negative intercepts. The gain applied to subsequently received signals is dynamically adjusted on the basis of a resonance width parameter of a detected resonance frequency, described illustratively herein as the ratio between the positive and negative slope intercept frequencies C/D.

Stated another way, the reference threshold may be adjusted up or down so as to intersect the received signals at frequencies separated by a particular "width" on either side of a peak resonance frequency, corresponding to an amplitude 5 dB below the resonance peak amplitude. Once "locked on" to a particular harmonic resonance the gain, or alternatively reference threshold, is maintained at a level where positive and negative slope intercepts will be detected as the resonance frequency varies with piston movement.

In order for the foregoing dynamic gain adjustment to be effective, an initial gain or reference threshold at which positive and negative intercepts will occur must first be determined. As progress in the art of electromagnetic wave piston position sensing in hydraulic cylinders continues, earlier and more reliable locking onto resonance frequencies is desired.

Moreover, a given piston position may have multiple resonance harmonics of various amplitudes over the swept frequency range. As a result a need is present for the ability to distinguish the signals of the various resonance harmonics.

DISCLOSURE OF THE INVENTION

The ability to lock onto and identify particular resonance harmonics is achieved by adjusting an attenuation level of automatic gain control in a series of steps to detect positive and negative slope intercepts for two consecutive harmonics. A identification ratio is then calculated between the frequencies of the two harmonics, indicative of the order of each harmonic. The identification ratio is useful in providing the ability to reliably "lock on" to a particular resonance harmonic.

In the identification, the lowest frequency at which a longitudinal standing wave is formed for a given piston position is referred to herein as a first order harmonic. When the identification ratio indicates that the first order harmonic has been detected, the automatic gain control begins adjusting the attenuation level on the basis of a resonance width parameter.

BRIEF DESCRIPTION OF THE DRAWINGS

FIG. 3 is an illustration of the frequency vs amplitude relationship of a plurality of consecutive resonance harmonics.

DESCRIPTION OF THE INVENTION

In a hydraulic cylinder cavity there is high loss of the transmitted signal except at a resonance frequency which is at a piston position or cavity length where energy is coupled into a particular mode resonance standing wave thereby producing a significant signal.

The respective harmonic resonance frequencies are lower when the cavity is longer and are higher when the cavity is shorter. Correspondingly the amplitude of each resonance frequency will vary with the cavity length, the lower amplitudes being at the lower frequencies and the higher amplitudes being at the higher frequencies.

There are variations in piston position sensing systems in the art among: having the cavity on the rod or on the head side of the piston; the excitation of particular mode standing waves; and the sensing of a harmonic other than the fundamental of a particular resonance frequency. For purposes of simplicity and clarity of explanation in the preferred embodiment, a cavity on the rod side of the piston, excitement in the TEM mode and the sensing of the fundamental of the particular resonance frequency for the particular piston position or cavity length, will be discussed.

Figure 1:
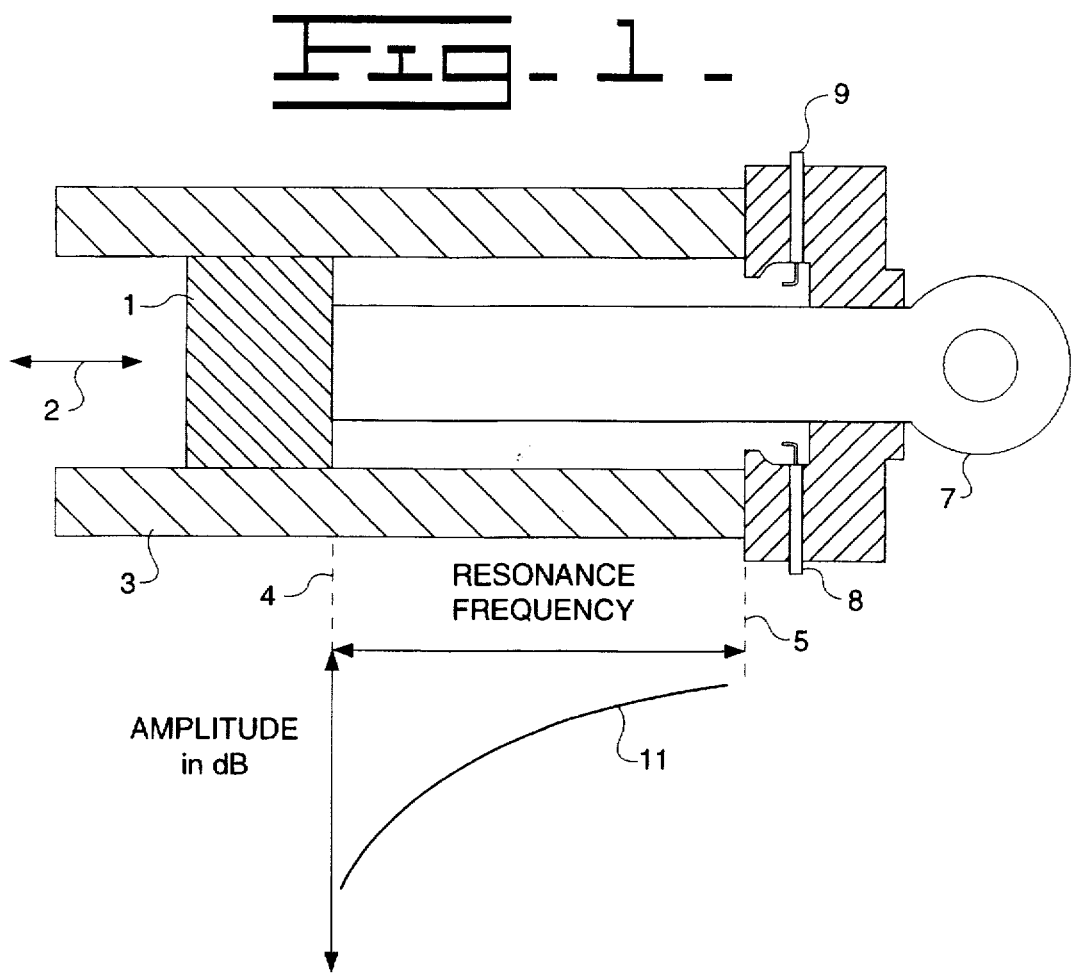
FIG. 1 is an illustration of the dimensional correlation of resonance frequency peaks with piston position, in the oil in the hydraulic cylinder, between the extended and collapsed limits of piston travel.

In FIG. 1 there is illustrated the dimensional correlation of resonance frequency peaks with piston position in the oil in a hydraulic cylinder between the extended and collapsed limits of piston travel.

In a position sensing system, a varying frequency electromagnetic wave signal, is transmitted into the hydraulic fluid in the cylinder. The input electromagnetic wave signal is swept over the range of critical frequencies at which resonance of the cavity that is made up of the cylinder, the piston and the cylinder end, will take place within the range of piston travel. A frequency signal is sensed in the hydraulic fluid and is delivered to a signal receiver where information is extracted from the sensed frequency signal that permits identification of the position and motion parameters of the piston.

Referring to FIG. 1, a piston 1 travels as indicated by the double directional arrow 2 in a cylinder 3 between a limit 4 at the expanded end of the cavity or travel and a limit 5 in the vicinity of an end 6. A rod 7 attached to the piston 1 passes through the end 6.

When the piston 1 is at the stop 5, the cavity is considered collapsed. The cavity contains hydraulic fluid introduced and removed through ports, not shown, and into which electromagnetic waves in frequencies that vary over the range of critical frequencies at which resonance will occur within the piston travel are introduced through a transmission coupler 9 and received through a receiving coupler 10 positioned about 90 degrees around the periphery of cylinder 3. FIG. 1 further illustrates a dimensionally correlated graph of Resonance Frequency Peaks vs Amplitude or Gain, curve 11 depicting the nonlinear increase in fundamental resonance amplitude and frequency with decrease in cavity length as the piston travels from the extended cavity limit 4 toward the collapsed cavity limit 5.

FIG. 3 illustrates a similar non-linear variation in amplitude between a number of harmonics formed within a single cavity length as the frequency is swept over the range of critical frequencies. In order to cover the entire range of possible cavity lengths, the frequency is generally varied over a range, for example, of 50 megahertz to 1.6 gigahertz. Relatively high frequencies introduced into the cavity to detect short cavity lengths will generate standing waves corresponding to higher order harmonics $F_2, F_3, F_4$ and $F_5$ which might be confused with a first order harmonic resonance $F_1$ corresponding to an input frequency having a period twice the cavity length.

Resonance harmonics form in an ideal coaxial cavity according to the equation:

$$f_{res} = n/2 * [c/SQRT(E_r) * 1/L_c] (n=1,2,3 \ldots)$$

where c is the speed of light, $E_r$ is the relative permittivity of the fluid, $L_c$ is the cavity length and n corresponds to the harmonic order. For a fixed cavity length and constant operating conditions, it can be seen that the ratio between the frequencies of any two consecutive resonance harmonics will have the relationship n+1/n. Accordingly, two resonance frequencies consecutively detected according to the present invention can be identified according to their harmonic order. By way of example, the first and second harmonics will have a frequency ratio of about two, the second and third a ratio of about three halves, the third and fourth a ratio of about four thirds.

In correlating piston position with a particular resonance frequency signal, for accuracy it is essential that there be ability to lock onto a particular one of the resonance harmonic, and to be able to distinguish between them. Piston position is preferably determined using a table look up indexed to the first order resonance frequency. Locking onto higher order modes would result in an erroneous position being returned unless the particular harmonic were identified and a look up performed according to an adjusted index.

In accordance with the invention the resonance harmonics can be identified and can be distinguished from each other by a comparison of frequency ratio between two consecutively detected harmonics.

While there are a number of ways in the art of detecting a fundamental resonance frequency, in accordance with the invention, the use of "frequency lock loop" circuitry to detect and track "lock on" points on the positive and negative slope intercepts of the resonance frequency signal envelope, together with selection of the location level of those "lock on" points with reference to the gain or amplitude dB and width of the envelope at that location level, permits calculations that yield highly accurate resonance frequency values. Computation is then employed in correlating the resonance signal information with the piston position.

The piston position determining responsiveness and accuracy of the sensing system can be affected by the ability of the system to quickly identify and "lock on" to a particular resonance signal and to distinguish among the resonance harmonics of that resonance. The locking check is particularly valuable at "start up" of the position sensing system to prevent "locking on" to the wrong resonance and for quick recovery when "lock" is lost due to an external event such as power interruption.

Figure 2:
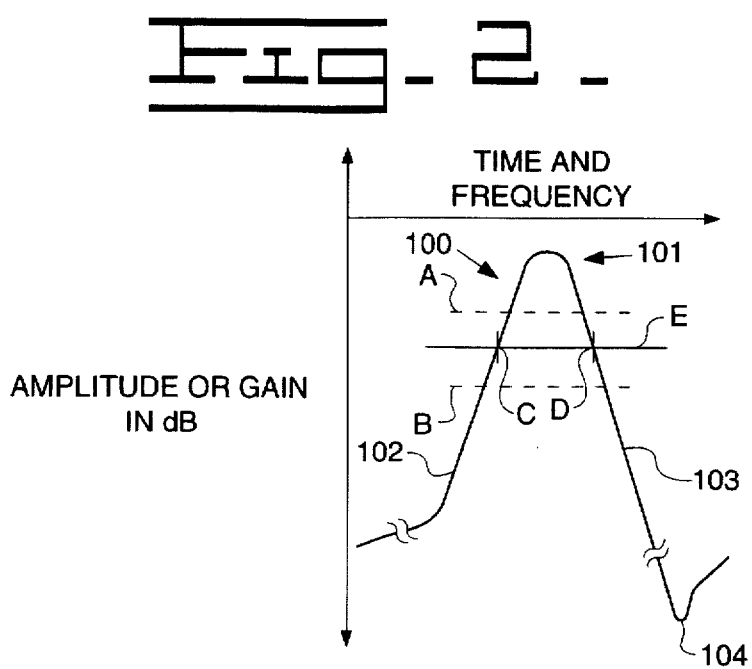
FIG. 2 is an illustration of the use of slope intercepts and gain adjustment in developing resonance signal comparison information.

Further, the ability to identify and double "lock on" to a specific subsequent harmonic of a specific resonance frequency is of substantial benefit where other parameters of the system produce conditions where operation must be higher on the curve illustrated in FIG. 2.

In FIG. 2, which is a more detailed illustration of the electromagnetic wave resonance signals of FIG. 3, the envelope 100 of frequencies near resonance 101 has positive slope 102 crossing a reference threshold E at positive intercept C and negative slope crossing reference threshold E at negative intercept D. The signal often continues to an anti-resonance 104. The reference level E is separated from the peak region 13 by several dB on the Gain scale. The separation serves as an accommodation for the factors that prevent accurate measurement. The use of positive and negative intercepts and the selection of the reference threshold or gain level that is separated from the peak region 101 is employed in the art, such as in U.S. Pat. No. 5,325,063. The best performance is usually obtained when the level E is approximately 5 dB below the resonance peak region.

In the establishing of the C and D values of the positive 102 and negative 103 resonance signal slope intercepts, the sensing circuitry of the piston position sensing apparatus, "locks on" to the resonance frequency envelope at intercept C as the varying input frequency signal introduced at coupler 9 progresses; then steps to the range for "lock on" to the negative slope intercept D. An effective value for the center frequency of the resonance is established which in turn is to be used in a correlation with piston travel.

An accurate effective value for the center resonance frequency would be a function of C and D that can be expressed as F(C ,D ), the simplest example of which would be expressed as in equation 1.

Equation 1 $F(resonance)=(C+D)/2$

The ratio between the intercepts determines a resonance width parameter that can be expressed as D/C; any other equivalent expression of a resonance width parameter such as loaded "Q", could also be used. Once a particular resonance has been locked on, the threshold E or a gain correction applied to the received signals can be dynamically adjusted up or down to levels A or B in order to correct the slope intercept points in accordance with a preferred width parameter corresponding to 5 dB below peak.

In operation, an initial reference threshold 200 is selected on start up, at which none of the received frequency signals will intercept. The threshold level is decreased in 1 dB increments, until at some gain or amplitude level 202 positive and negative intercepts are detected for consecutive harmonics $F_4$ and $F_5$. Effective resonance frequencies would then be generated from the slope intercepts, and the ratio of those frequencies determined. In FIG. 2, the relatively higher amplitude fourth and fifth harmonics would be detected first and identified as such by their frequency ratio of five-fourths (1.2). If it was desired to instead lock onto the first harmonic, the threshold would accordingly again be adjusted downward, and the range of input frequencies once again swept, in successive iterations until an appropriate initial locking threshold 204 is determined. Thereafter, the gain may be dynamically adjusted on the basis of a resonance width parameter to track the first harmonic as the piston moves.

Although the present invention has been described in terms of tracking resonance frequencies, values corresponding to a reference period or like measure could be tracked instead. Similarly, it makes little practical difference whether the threshold is held constant and the gain applied to the signal adjusted, a constant gain is applied to the signal and the threshold varied, or some combination of the two.

What has been described is a technique to for locking onto and identifying each resonance harmonic within a swept frequency range by determining ratios between consecutive detected resonance frequencies.

What is claimed is:

1. In a hydraulic cylinder piston position sensing system of the type wherein frequency standing wave resonances are established in the oil of the cylinder by transmission of a swept frequency range of electromagnetic signals into the oil, and resonance harmonics are detected in a receiving section by signal amplitude comparison with a threshold, the improvement comprising:

locking onto a particular order harmonic among a plurality of resonance harmonics established in the oil by determination in the receiving section of the frequency ratio between consecutive harmonics.

2. The improvement of claim 1 wherein said consecutive harmonics are detected by receiving the frequency signals and after each sweep incrementally reducing an attenuation level applied to the received signals until successive pairs of positive and negative slope intercepts are detected.

3. The improvement of claim 2 wherein said frequency ratio is determined when said successive pairs are detected within a single pass through the swept range of frequencies.

4. The improvement of claim 1, further comprising said receiving section dynamically adjusting a gain applied to the received signal prior to said comparison on the basis of a resonance width parameter to track the first harmonic as the piston moves.

5. The process of verifying a "lock on" to a first order harmonic resonance signal in a hydraulic cylinder piston positioning system wherein the piston position is correlated with a resonance in the oil of said cylinder produced by an input electromagnetic signal that varies over a range of significant frequencies corresponding to travel of the piston in said cylinder, comprising the steps of:

receiving the signal after transmission though the oil;
   detecting consecutive harmonics within a single sweep of the input signal across said range of significant frequencies;
   determining a ratio between the frequencies of the consecutively detected harmonics; and
   verifying a lock onto the first order harmonic resonance signal when the ratio is substantially equal to two.

6. The process of claim 5, said step of detecting consecutive harmonics comprising:

applying a constant gain adjustment to the received signals;
   comparing said gain adjusted received signals to a reference threshold to detect first positive and negative slope intercepts and second positive and negative slope intercepts; and
   identifying the harmonic frequencies corresponding to said first and second slope intercepts.

7. The process of claim 6, said step of detecting consecutive harmonics further comprising:

incrementally changing said constant gain adjustment to increase the gain of the received signals upon failing to detect said second slope intercepts.

8. The process of claim 6, said step of detecting consecutive harmonics further comprising:

incrementally reducing said reference threshold upon failing to detect said second slope intercepts.

* * * * *